(12) United States Patent
Tuominen et al.

(10) Patent No.: US 11,219,120 B2
(45) Date of Patent: Jan. 4, 2022

(54) STRESS RELIEF OPENING FOR REDUCING WARPAGE OF COMPONENT CARRIERS

(71) Applicant: AT&S (China) Co. Ltd., Shanghai (CN)

(72) Inventors: Mikael Tuominen, Shanghai (CN); Artan Baftiri, Shanghai (CN); Nick Xin, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 106 days.

(21) Appl. No.: 16/583,399

(22) Filed: Sep. 26, 2019

(65) Prior Publication Data
US 2020/0100358 A1  Mar. 26, 2020

(30) Foreign Application Priority Data

Sep. 26, 2018  (CN) .......................... 201811126687.8

(51) Int. Cl.
| | | |
|---|---|---|
| *H05K 1/02* | (2006.01) | |
| *H05K 1/18* | (2006.01) | |
| *H05K 3/46* | (2006.01) | |
| *H05K 3/40* | (2006.01) | |
| *H05K 1/11* | (2006.01) | |

(52) U.S. Cl.
CPC .......... *H05K 1/0271* (2013.01); *H05K 1/185* (2013.01); *H05K 3/4644* (2013.01); *H05K 1/115* (2013.01); *H05K 3/4038* (2013.01); *H05K 2201/09036* (2013.01)

(58) Field of Classification Search
CPC ............... H05K 1/0271; H05K 1/0225; H05K 1/182–188; H05K 1/115; H05K 1/03; H05K 3/4644; H05K 3/4038; H05K 3/4697; H05K 2201/09036; H05K 2201/068; H05K 2201/09618; H05K 2201/09854; H05K 2201/09136; H05K 2201/0187; H05K 2201/09718; H05K 2201/09909; H05K 2201/09745; H05K 2201/0969; H05K 2201/10022; H01L 2224/32225

See application file for complete search history.

(56) References Cited

U.S. PATENT DOCUMENTS

| | | | |
|---|---|---|---|
| 7,480,153 B2 * | 1/2009 | Kong .................. | H05K 1/0218 361/760 |
| 2008/0093113 A1 * | 4/2008 | Jow ..................... | H05K 1/0224 174/260 |

(Continued)

FOREIGN PATENT DOCUMENTS

JP          2017152495 A       8/2017

*Primary Examiner* — Roshn K Varghese
(74) *Attorney, Agent, or Firm* — Robert A. Blaha; Smith Tempel Blaha LLC

(57) ABSTRACT

A component carrier includes a stack comprising at least one electrically insulating layer structure and/or at least one electrically conductive layer structure, a component embedded in the stack, and at least one stress relief opening formed in each of the at least one electrically conductive layer structure arranged in the stack on one side of the component so that a portion of the stack extending from an exterior main surface of the component carrier up to a main surface of the component on said side and including the at least one stress relief opening is free of electrically conductive material.

20 Claims, 2 Drawing Sheets

(56) References Cited

U.S. PATENT DOCUMENTS

| | | | |
|---|---|---|---|
| 2011/0298109 A1* | 12/2011 | Pagaila | H01L 24/97 |
| | | | 257/660 |
| 2014/0041907 A1 | 2/2014 | Kim et al. | |
| 2014/0048321 A1 | 2/2014 | Sugiyama et al. | |
| 2017/0033025 A1* | 2/2017 | Gu | H01L 23/552 |
| 2017/0042033 A1* | 2/2017 | Nishino | H05K 1/0298 |
| 2017/0295643 A1* | 10/2017 | Suzuki | H01L 23/3121 |

* cited by examiner

STRESS RELIEF OPENING FOR REDUCING WARPAGE OF COMPONENT CARRIERS

TECHNICAL FIELD

The invention relates to a component carrier, a manufacturing method, and a panel.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Moreover, efficiently embedding a component in a component carrier is an issue. In particular, component carriers with embedded components show the tendency of warpage.

SUMMARY

There may be a need to embed a component in a component carrier with low warpage.

According to an exemplary embodiment of the invention, a component carrier is provided which comprises a stack comprising at least one electrically insulating layer structure (in particular a plurality of electrically insulating layer structures) and/or at least one electrically conductive layer structure (in particular a plurality of electrically conductive layer structures), a component embedded in the stack, and at least one stress relief opening formed in each of the at least one electrically conductive layer structure arranged in the stack on one side of the component so that a portion of the stack extending (in particular perpendicular to main surfaces of the stack) from an exterior main surface of the component carrier up to a main surface on said side of the component and including the at least one stress relief opening is free of electrically conductive material.

According to another exemplary embodiment of the invention, a method of manufacturing a component carrier is provided, wherein the method comprises forming a stack comprising at least one electrically insulating layer structure (in particular a plurality of electrically insulating layer structures) and/or at least one electrically conductive layer structure (in particular a plurality of electrically conductive layer structures), embedding a component in the stack, and forming at least one stress relief opening in each of the at least one electrically conductive layer structure arranged in the stack on one side of the component so that a portion of the stack extending (in particular perpendicular to main surfaces of the stack) from an exterior main surface of the component carrier up to a main surface of the component on said side, the portion including the at least one stress relief opening, is free of electrically conductive material.

According to another exemplary embodiment of the invention, a panel is provided which comprises an array of a plurality of panel sections each comprising a component carrier having the above-mentioned features.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stress relief opening" may particularly denote a recess or through hole which is formed in an electrically conductive layer structure of a component carrier at a specifically selected position at which pronounced stress may occur resulting in a warpage tendency of the component carrier. The stress relief opening may be a void and/or may be at least partially filled with dielectric material but should be free of electrically conductive material. By forming a stress relief opening at an appropriate position of the electrically conductive layer(s) of the component carrier above the component and with an appropriate dimension and/or shape, such a tendency of warpage may be efficiently prevented.

In the context of the present application, the term "panel" may particularly denote a plate-like structure which may be processed for component carrier manufacture in a batch procedure. After processing, such a panel may be singularized into multiple component carriers. For instance, a panel may have a size of 12 inches×18 inches.

According to an exemplary embodiment of the invention, a component carrier is provided which comprises a stress relief opening reducing the stress acting on the component carrier during manufacture and/or during use. For the purpose of forming the one or more stress relief openings above and/or below an embedded component, each and every metal layer at least on one side of a component (in particular on a non-connection side of the component) may be interrupted, for instance each may be correspondingly recessed. Conventionally, component carriers with embedded components are specifically prone to warpage. However, it has turned out surprisingly that by the formation of one or more non-metallic stress relief windows vertically above and/or below the embedded component(s), such a tendency of warpage may be suppressed.

Hence, an exemplary embodiment of the invention provides a design-for-embedding concept that actively reduces the stress of the package or component carrier and enables embedded component carrier (in particular printed circuit board, PCB) concepts that are otherwise not feasible because of reliability or warpage issues. A central advantage of exemplary embodiments of the invention is to enable a wider range of embedded component applications.

In the following, further exemplary embodiments of the component carrier, the method and the panel will be explained.

In an embodiment, the mentioned portion consists exclusively of electrically insulating material, in particular electrically insulating material of the at least one electrically insulating layer structure. Thus, the at least one stress relief opening or window may be free of metallic material such as copper. It has turned out surprisingly that the provision of a metal free window extending from an exterior surface of the component carrier uninterruptedly up to an upper or lower main surface of the component carrier may efficiently reduce mechanical load exerted on the component carrier with an embedded component. A corresponding portion of the stack may correspondingly consist of dielectric material (in particular comprising resin such as epoxy resin, optionally comprising reinforcing particles such as glass fibers). In particular, the portion may be free of copper. Correspondingly, the one or more stress relief openings may be holes extending through one or more electrically conductive layer structures (such as copper foils).

In another embodiment, the portion is a hollow cavity. Hence, it is also possible that a hollow cavity is formed (for instance by mechanically drilling, milling or laser cutting) from an exterior main surface of the component carrier up to the embedded component, thereby also forming one or multiple through holes traversing metallic layers between an exterior surface and the component.

In an embodiment, a plurality of stress relief openings are formed in each of a plurality of electrically conductive layer structures arranged in the stack on said side of the component so that the portion of the stack extending from the exterior main surface of the component carrier up to the said main surface of the component includes the plurality of stress relief openings and is free of electrically conductive material. Thus, even sophisticated electric coupling tasks may be accomplished with the multiple electrically conductive layer structures each of which being traversed by a corresponding one of the stress release openings.

In an embodiment, the plurality of stress relief openings is in alignment with one another or may be in flush with one another. Descriptively speaking, when viewing onto the component carrier from an upper main surface thereof, edges delimiting the multiple stress release openings may appear as identical annular lines. In other words, connecting the edges delimiting the multiple stress release openings may result in a circumferential array of vertically extending straight lines. A particularly pronounced stress relief may be obtained with the described design.

As an alternative to aligned stress relief openings, stress relief openings may also overlap and/or one stress relief opening may appear as a part of another stress relief opening (i.e. may be located within another stress relief opening) in a viewing direction perpendicular to main surfaces of the component carrier.

In an embodiment, the portion is a cylindrical structure, in particular a circular cylindrical structure, extending through the respective electrically conductive layer structure. When a number of aligned stress relief openings are circular through holes, the portion comprising these circular through holes is of circular cylindrical shape.

In an embodiment, the portion is defined by dielectric material of the stack being vertically delimited by the main surfaces of the component and the component carrier and being laterally delimited by one or more edges or edge portions of the stress relief openings and corresponding extensions into an interior of the component carrier. The latter edges or edge portions may correspond to a circumferentially closed ring visible when viewing from an exterior of the component carrier onto the embedded component with a viewing direction perpendicular to the main surfaces of component carrier and component (and assuming the electrically insulating layer structures were transparent).

In an embodiment, the component carrier comprises at least one further stress relief opening formed in each of the at least one electrically conductive layer structure arranged in the stack on an opposing other side of the component so that a further portion of the stack extending from another opposing exterior main surface of the component carrier up to another opposing main surface of the component on said opposing other side and including the at least one further stress relief opening is free of electrically conductive material. Hence, both opposing main surfaces of the embedded component may be provided with a corresponding stress relief opening so that a highly efficient suppression of stress is effective on both opposing main surfaces of the component embedded in the component carrier.

In an embodiment, the component (for instance a semiconductor chip) comprises at least one pad on one or both of two opposing main surfaces of the component. The at least one pad may be formed on, in particular exclusively on, another opposing main surface of the component facing away from the at least one stress relief opening. Thus, the pad-side of the component may be used for electric contacting purposes, whereas the opposing non-pad side may be used for stress relief.

In an embodiment, no further stress relief opening is formed on the side of the component on which the at least one pad is formed. Consequently, there is no impact on flexibility of a circuit designer for accomplishing any desired electric connection on the pad side of the component.

However, alternatively, it is also possible that one or more additional stress relief openings is or are formed also on the pad-side of the component, for instance extending between adjacent pads. Furthermore, it is possible that pads are formed on both opposing main surfaces of the components, and one or more stress relief openings are formed between one or both of these main surfaces and exterior main surfaces of the component carrier as well.

In an embodiment, the at least one stress relief opening is fully circumferentially delimited by material of the respective electrically conductive layer structure, in particular is a through hole, more particular a circular through hole. It is also possible that the at least one electrically conductive layer structure is a continuous layer having a single through hole forming an assigned one of the at least one stress relief opening. In other words, the stress relief openings may be formed as annularly closed structures. Thus, a for instance continuous metal foil may be provided with one or more interior through holes forming the stress relief openings.

In an embodiment, a ratio between an area of a respective one (in particular of each individual one) of the stress relief openings and an area of the main surface of the component is at least 10%, in particular is at least 20%. It has turned out that a significant stress relief can already be obtained when at least 10% of a respective main surface of the component is connected with the portion extending up to the exterior main surface of the component carrier and encompassing the one or more stress relief openings. When this partial area is at least 20%, even an excellent stress relief property may be obtained. Preferably, the ratio may be less than 90%. Hence, the area of an individual one of the stress relief openings may be smaller than the area of the main surface of the component.

In an embodiment, the at least one stress relief opening is configured for reducing warpage promoting stress exerted on the component carrier. Material, position and/or shape of the stress relief opening(s) and the corresponding above-mentioned portion of the stack are design parameters in this context.

In a preferred embodiment, the component carrier comprises at least one stress relief structure arranged in the stack and at least partially within a central plane of the component. Correspondingly, the panel may comprise at least one stress relief structure arranged at least partially in a connection line connecting at least two of the components. In the context of the present application, the term "stress relief structure" may particularly denote a physical structure which is integrated in a panel or a component carrier at a specifically selected position at which pronounced stress may occur resulting in a warpage tendency of the component carrier (which may be manufactured on the basis of such a panel). By integrating a stress relief structure at an appropriate position of the component carrier or panel and with an appropriate material and/or shape, such a tendency of warpage may be efficiently prevented. According to an exemplary embodiment of the invention, a panel and a component carrier manufactured on the basis of such a panel are provided which comprise a stress relief structure reducing the stress acting on the component carrier during manufacture and/or during use. Conventionally, component carriers with embedded components are specifically prone to such warpage. However, it has turned out surprisingly that the integration of a stress relief structure at a virtual (in particular horizontal) straight connection line connecting different components of different component carriers of a panel, such a tendency of warpage may be suppressed.

In a highly preferred embodiment, the component carrier and/or the panel is provided with a combination of at least one stress relief opening and at least one stress relief structure, as described herein. As a result, a highly efficient stress relief can be obtained both within a horizontal plane and in a vertical axis perpendicular thereto.

In an embodiment, the at least one stress relief structure is configured for reducing warpage promoting stress exerted on the component carrier. Material, position and/or shape of the stress relief structure are design parameters in this context.

In an embodiment, at least part of the at least one stress relief structure is shaped as a sheet extending perpendicular to the main surfaces of the component carrier. For instance, a cavity or slit with a sheet shape may be formed in the stack. Thereafter, such a recess may be filled with electrically conductive material such as metal, in particular copper. Such a filling procedure may be accomplished for example by plating.

In an embodiment, at least part of the at least one stress relief structure comprises a plurality of parallel posts extending perpendicular to the main surfaces of the component carrier. For instance, vias may be formed by laser drilling or mechanically drilling and may be filled thereafter with electrically conductive material such as a metal, in particular copper.

In an embodiment, at least part of the at least one stress relief structure comprises or consists of copper. Any other appropriate metallic material may be used as well. In another embodiment, the stress relief structure may also be configured of a plastic material or a material having plastically deformable properties.

In an embodiment, at least part of the at least one stress relief structure may have plastic stress behavior. It is also possible that at least part of the at least one stress relief structure may function as a low modulus elastic stress buffer.

In an embodiment, a coordinate of a center of gravity of the at least one stress relief structure in a direction perpendicular to the main surfaces of the component carrier corresponds to a coordinate of a center of gravity of the component in the direction perpendicular to the main surfaces of the component carrier. In other words, a height level of a center of gravity of the stress relief structure(s) and a height level of a center of gravity of the components may be identical and may both be located on the above-mentioned connection line. It has turned out that stress propagation predominantly occurs at the mentioned height level in a horizontal direction of the panel or component carrier and can be efficiently suppressed by the described geometrical condition.

In an embodiment of the panel, at least part of the at least one stress relief structure is arranged in a transition region of the panel between the component carriers. When being positioned in a transition region between panel sections or component carriers, unused surface regions of the panel may be used for improving warpage. At the same time, the component carriers may be made very compact, since they do not need to include a stress relief structure itself in the described embodiment.

In an embodiment of the panel, part of the stress relief structures is arranged at least partially in a further connection line connecting at least two of the components and extending perpendicular to the connection line. Hence, the stress relief function may be established in two mutually perpendicular directions within a plane defined by the panel (more precisely defined by its two opposing main surfaces). Stress relief structures may be arranged along two orthogonal directions to thereby further refine the stress relief effect in the component carriers and the panel.

The component(s) can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as component.

In an embodiment, the panel or component carrier comprises a stack of at least one electrically insulating layer structure and at least one electrically conductive layer structure. For example, the panel or the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure. Teflon® is a registered trademark of the Chemours Company FC of Wilmington, Del. U.S.A.

In an embodiment, electrically conductive material of the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supraconductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
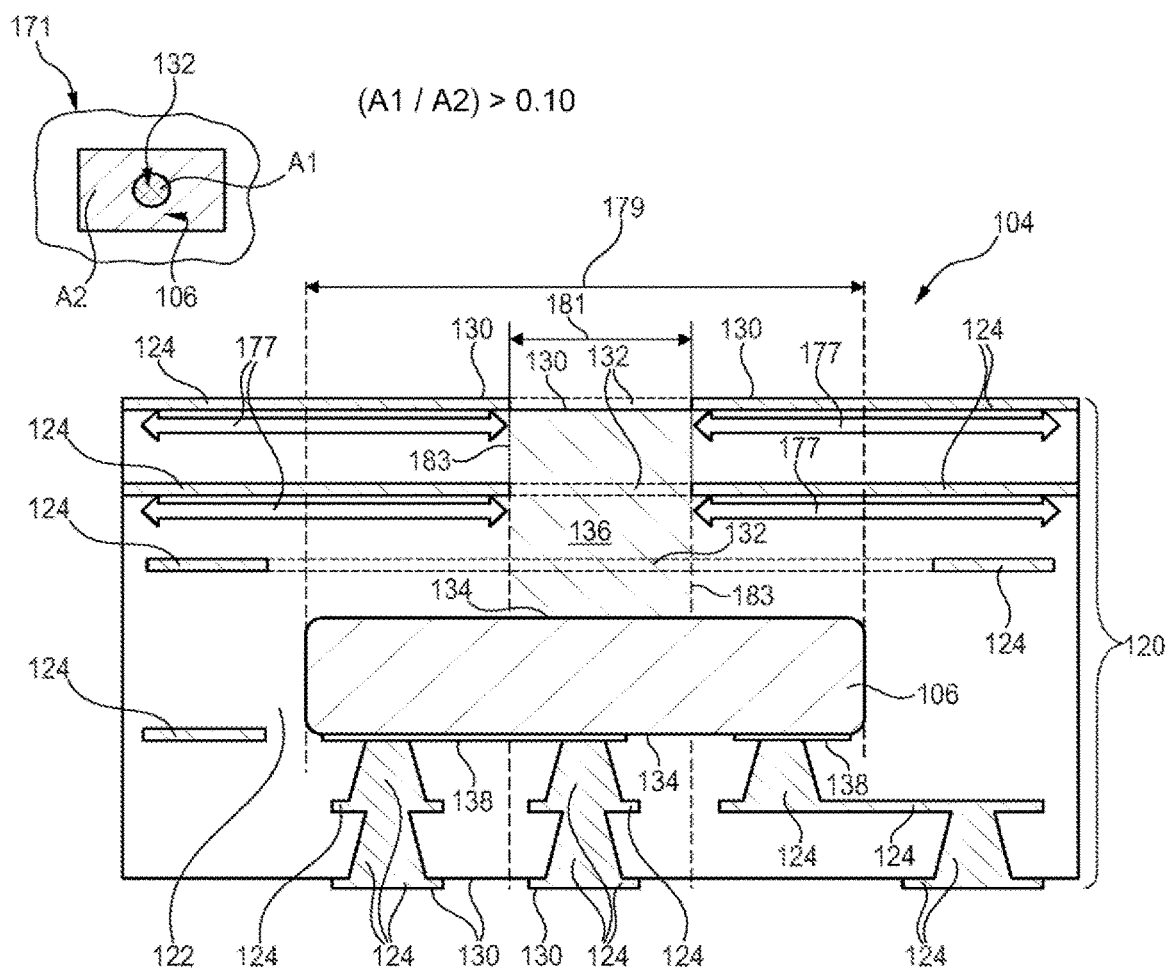
FIG. 1 illustrates a cross-sectional view of a component carrier with stress relief openings according to an exemplary embodiment of the invention.

The illustrations in the drawings are schematically presented. In different drawings, similar or identical elements are provided with the same references.

Before, referring to the drawings, exemplary embodiments will be described in further detail, some basic considerations will be summarized based on which exemplary embodiments of the invention have been developed.

According to an embodiment, a component carrier (such as a printed circuit board or PCB) with an embedded component and a high reliability and low mechanical stress is provided.

The mechanical stress inside of an embedded PCB package conventionally causes serious issues, such as warpage, specifically with components with a ceramic or silicon surface.

In particular, a highly efficient stress release may be obtained by an appropriate design of at least part of the adjacent layers of the component area of the component carrier, in particular a PCB. Based on studies of the present inventors, it has become possible to significantly improve the reliability of the package by ensuring a copper relief design on every layer (in particular on every metallic layer) on the embedded component area. Based on these studies, excellent results have been obtained when copper of such electrically conductive layer structures is spatially opened by at least 20% of the component area on every layer by implementing one or more stress relief openings. A significant improvement can however already be obtained when the mentioned area percentage provided by the stress relief opening(s) is at least 10%.

Based on long-time studies exemplary embodiments of the invention have identified a way to additionally reduce the stress by preparing a design-for-embedded PCBs concept. Such a solution provides an architecture significantly improving the reliability of the package or component carrier with low effort. More specifically, a horizontal cumulative stress relief may be accomplished by a plastic stress barrier or stress relief structure. In particular, it may be advantageous to implement a barrier layer that can be made of plastic or metal and can partly or entirely cancel the cumulating stress in the center of the package or component carrier. The stress relief structure may be made of a plastically deformable material. By taking this measure, it may be possible to reduce or avoid warpage behavior of the embedded PCB, or more generally of a component carrier with an embedded component. Highly advantageously, it may be possible to improve the reliability and warpage performance significantly to enable a wider range of embedded component applications. This may be obtained substantially without involving any additional effort.

The present inventors have concluded reliability tests that show in particular the following improvement: Without stress relief design, failure occurred after 3 reflow cycles. With stress relief design, the product passed even after 15 reflow cycles. Results have been proven and repeated with 10 lots.

FIG. 1 illustrates a cross-sectional view of a component carrier 104 with copper-free stress relief openings 132 in electrically conductive layer structures 124 vertically above an embedded component 106 according to an exemplary embodiment of the invention.

The illustrated component carrier 104 is configured as a laminate-type plate-shaped printed circuit board (PCB). The component carrier 104 comprises a laminated stack 120 comprising multiple electrically insulating layer structures 122 which may comprise resin (such as epoxy resin), optionally including reinforcing particles (for instance glass fibers). Furthermore, the stack 120 comprises a plurality of electrically conductive layer structures 124 which may be continuous copper foils, patterned copper foils and/or copper filled via (for instance laser vias and/or mechanically drilled vias). The layer structures 122, 124 may be connected with one another by lamination, i.e. the application of heat and/or pressure.

One or more components 106 may be embedded in the stack 120. For instance, the component 106 shown in FIG. 1 may be a semiconductor chip such as a processor or a memory.

As can be taken from FIG. 1, in this case three stress relief openings 132 are formed as through holes directly above the component 106 in each of the electrically conductive layer structures 124 arranged in the stack 120 on an upper side of the component 106. As a result, a portion 136 (dashed in FIG. 1) of the stack 120 is formed or delimited which extends from an exterior upper main surface 130 of the component carrier 104 up to an upper main surface 134 of the component 106 and which includes the stress relief openings 132. The portion 136 is laterally delimited by virtual vertical side walls 183 defined by the lateral most narrow limits of the stress relief openings 132. An upper end of the portion 136 is defined by the upper main surface 130 of the component carrier 104. A lower end of the portion 136 is defined by the upper main surface 134 of the component 106. The lateral limits of the portion 136 corresponds to vertical lines or side walls 183 relating to a fully uninterrupted dielectric stack portion above the component 106. In the shown embodiment, the electrically conductive layer structures 124 above the upper main surface 134 of the component 106 are each a continuous layer having only a single through hole forming an assigned one of the stress relief openings 132. The entire portion 136 is free of electrically conductive material of electrically conductive layer structures 124 and, in the shown embodiment, consists exclusively of electrically insulating material of the electrically insulating layer structures 122 of the stack 120. Alternatively, the portion 136 may be or comprise a hollow cavity (not shown). The outermost two of the three stress relief openings 133 are in vertical alignment with one another, i.e. have sidewalls being vertically in flush with one another. The lowermost stress relief opening 133 is wider.

As shown in FIG. 1 as well, the component 106 comprises pads 138 only on a lower main surface 134 of the component 106 facing away from the stress relief openings 132 in the upper portion of the stack 120. No further stress relief opening is formed on the bottom or lower side of the component 106 on which the pads 138 are formed. Hence, the portion of the stack 120 corresponding to the side of the component 106 with the pads 138 may be denoted as connection side. Correspondingly, the part of the stack 120 above the pad free main surface 134 of the component 106 may be denoted as non-connection side and is opened upwardly via the stress relief openings 132.

As can be taken from a detail 171 in FIG. 1 showing a plan view, the stress relief openings 132 may be fully circumferentially delimited by material of the respective electrically conductive layer structures 124 so as to form a through hole, in the shown embodiment a circular through hole. Still referring to detail 171, a ratio between an area A1 of the shown stress relief opening 132 and an area A2 of the here rectangular upper main surface 134 of the component 106 may be preferably at least 10%, more preferably at least 20%. In other words, it is preferred that at least 10% of the component area is opened for each layer. Advantageously, such sufficiently large stress relief openings 132 may efficiently reduce warpage promoting stress exerted on the component carrier 104.

With the architecture described referring to FIG. 1 implementing copper relief openings, embedding of components 106 in a component carrier 104 may be performed with reduced stress. More precisely, stress in the xy-plane may be reduced. The xy-plane may be defined as the plane corresponding to the main surfaces 130, 134 and may be oriented perpendicular to the paper plane of FIG. 1 while including the horizontal axis according to FIG. 1. The xy-plane stress is indicated schematically by reference numeral 177 in FIG.

1. Moreover, the component area A2 is also indicated by reference numeral 179 in FIG. 1, whereas the stress release opening area A1 corresponds to reference numeral 181 in FIG. 1.

Figure 2:
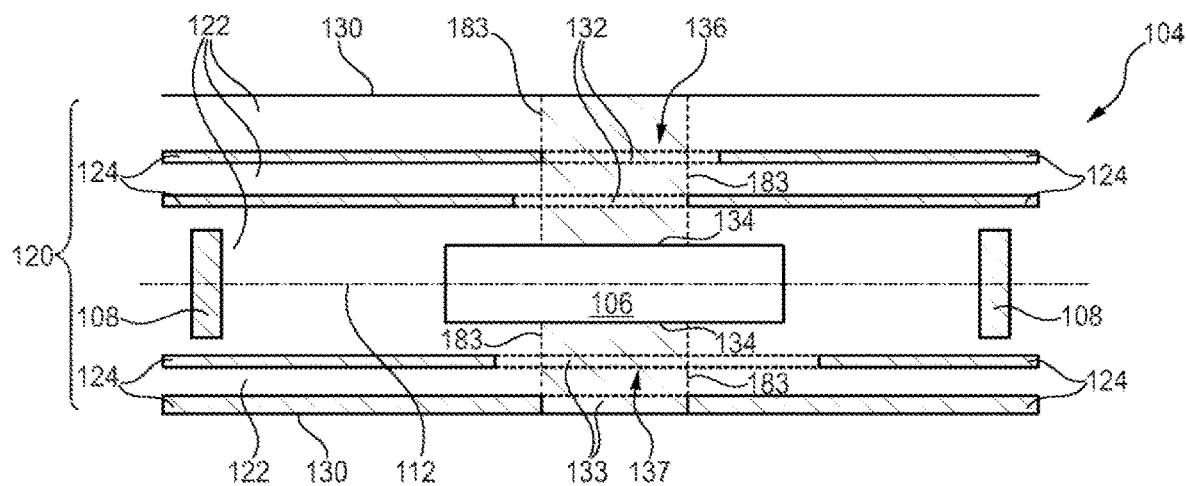
FIG. 2 illustrates a cross-sectional view of a component carrier with double-sided stress relief openings according to another exemplary embodiment of the invention.

FIG. 2 illustrates a cross-sectional view of a component carrier 104 with stress relief openings 132 according to another exemplary embodiment of the invention.

Advantageously, the component carrier 104 of FIG. 2 additionally comprises further stress relief openings 133 formed in each of electrically conductive layer structures 124 arranged in the stack 120 below the lower main surface 134 of the component 106. Consequently, a further portion 137 (dashed in FIG. 2) of the stack 120 extending from the lower main surface 130 of the component carrier 104 up to the lower main surface 134 of the component 106 is formed which includes the further stress relief openings 133 being free of electrically conductive material as well. Again, portion 137 is defined as uninterrupted fully dielectric vertical window between component 106 and exterior main surface 130 and is delimited by the lateral most narrow limits of the stress relief openings 132.

Even more advantageously, the component carrier 104 of FIG. 2 may optionally comprise additionally stress relief structures 108 arranged in the stack 120 and at least partially within a central plane 112 of the component 106. In particular by the combination of the stress relief openings 132 with the stress relief structures 108, highly advantageous properties in terms of stress relief may be obtained. Construction and function of the stress relief structures 108 will be described in below referring to FIG. 3 to FIG. 8.

Figure 3:
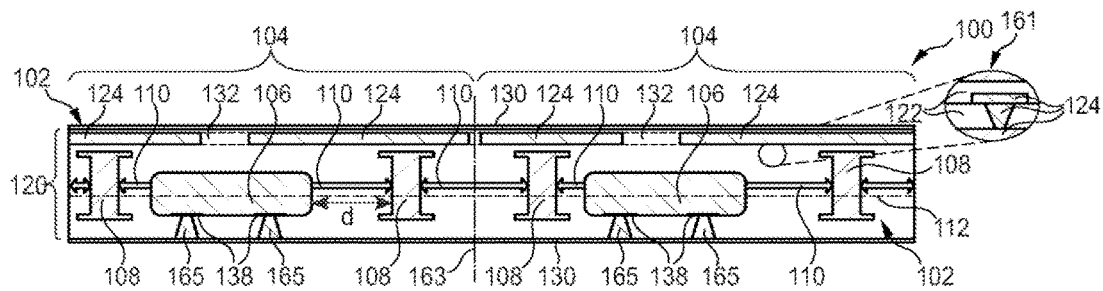
FIG. 3 illustrates a cross-sectional view of a panel comprising an array of component carriers according to an exemplary embodiment of the invention, wherein stress relief openings and stress relief structures are provided.

FIG. 3 illustrates a cross-sectional view of a panel 100 comprising an array of component carriers 104 according to an exemplary embodiment of the invention. Both stress relief openings 132 and stress relief structures 108 are provided in this embodiment for efficiently suppressing stress and preventing warpage. The panel 100 may be used for manufacturing the component carriers 104 on batch level. After completion of the manufacturing process, the panel 100 may be separated into individual cards or component carriers 104 by separation (for instance by cutting or etching) at separation line 163. The component carriers 104 may be laminate-type flat plate-shaped printed circuit boards (PCBs).

Figure 4:
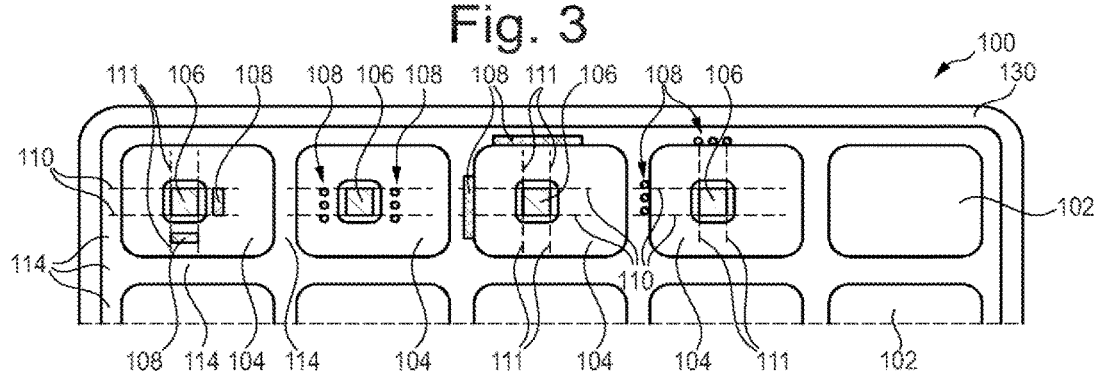
FIG. 4 illustrates a plan view of a panel comprising an array of component carriers according to an exemplary embodiment of the invention.

The panel 100 comprises a matrix-like array of a plurality of panel sections 102 arranged in rows and columns (compare FIG. 4). Each panel section 102 corresponds to a component carrier 104 or a pre-form of a component carrier 104 (i.e. a semifinished structure in form of a part of the panel 100, which semifinished structure may have the functionality of a component carrier 104 after completing the manufacturing process). A respective one of a plurality of components 106 (in particular semiconductor chips, for instance naked dies) is embedded in each of the panel sections 102 or corresponding component carriers 104. Pads 138 of the components 106 are connected to an exterior of the respective component carrier 104 by vertical through connections 165, for instance copper plated vias. Such component carriers 100 with embedded component 106 are specifically prone to warpage as a result of high mechanical stress.

Two respective of a plurality of stress relief structures 108, for instance made of copper, are arranged between two respectively juxtaposed component carriers 104. The stress relief structures 108 are located in and traverse a virtual connection line 110 connecting the components 106 of the various component carriers 104. Furthermore, the stress relief structures 108 are arranged partially within and thereby traversing a central plane 112 of the components 106. The stress relief structures 108 extend vertically according to FIG. 3, i.e. perpendicular to main surfaces 130 of the plate-like panel 100. More specifically, a coordinate of a center of gravity of the stress relief structures 108 in a vertical direction perpendicular to horizontal main surfaces 130 of the panel 100 is identical or substantially identical to a coordinate of a center of gravity of the components 106 in the vertical direction perpendicular to the horizontal main surfaces 130 of the panel 100. Descriptively speaking, stress forces may be effective in particular in a horizontal direction at a center of gravity of the embedded components 106 and may be prevented from propagating and causing artefacts such as warpage when fulfilling the mentioned geometric condition. In view of this arrangement, the stress relief structures 108 are capable of reducing warpage promoting stress exerted on the panel sections 102. Preferably, a lateral distance, d, between a side wall of component 106 and the adjacent stress relief structure 108 may be less than 10 mm.

Each of the component carriers 104 comprises a stack 120 comprising electrically insulating layer structures 122 (such as prepreg or FR4) and electrically conductive layer structures 124 (for instance made of copper), see detail 161. The assigned component 106 of a respective component carrier 104 is embedded in the stack 120. Some of the stress relief structures 108 are arranged in the stack 120 and partially within the central plane 112 of the component 106. Thus, reduced stress embedding due to features with elastic stress behavior may be obtained. For instance, plated copper structures like vias, slots, cavities can be formed in the stack 120 to act as a plastic stress buffer or stress relief structure 108 to cut the accumulating stress chain of the production format, i.e. panel 100.

FIG. 4 illustrates a plan view of a panel 100 comprising an array of component carriers 104 according to an exemplary embodiment of the invention. The stress relief openings 132 and corresponding electrically conductive layer structures 124 are omitted in FIG. 4 for the sake of clarity. FIG. 4 shows that a part of the stress relief structures 108 is arranged in the panel sections 102, whereas another part of the stress relief structures 108 is arranged in a transition region 114 between the panel sections 102.

The plastic stress relief buffers or stress relief structures 108 may be introduced to cut the stress chain in the horizontal plane of the embedded substrate or components 106. The stress may be reduced when at least one plastic property feature is implemented between the consecutive chain of embedded components 106 in at least one direction, preferably in two perpendicular directions. Plastic property features can be for example copper plated vias or slots, or it can be prepared of other material with plastic stress behavior.

FIG. 5 to FIG. 8 show plan views of individual panel sections 102 of the panel 100 of FIG. 4 illustrating stress relief structures 108 according to different exemplary embodiments of the invention.

Figure 5:
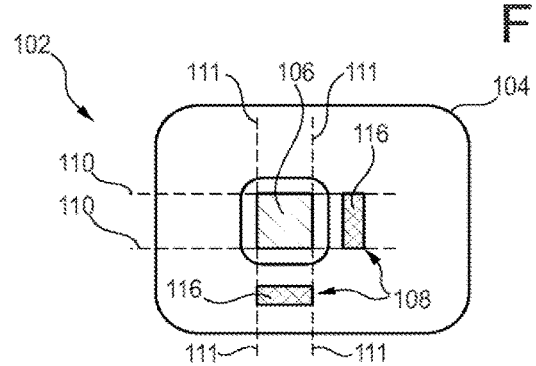
FIG. 5 to FIG. 8 show plan views of individual panel sections of the panel of FIG. 4 illustrating stress relief structures according to different exemplary embodiments of the invention.

Referring to FIG. 5, the stress relief structures 108 are shaped as sheets 116 extending perpendicular to the components 106. A part of the stress relief structures 108 extends along connection line 110, while another part of the stress relief structures 108 extends along further connection line 111. This intensifies the stress relief capability of the component carriers 104 after singularization, and of the panel 100 as a whole. Thus, plated slots in the core, build up and/or outer layer inside of the card area may be provided as stress relief structures 108.

Figure 6:
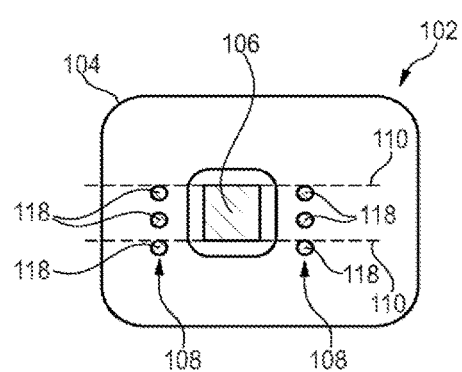

Referring to FIG. 6, the stress relief structures 108 comprise a plurality of parallel posts 118 extending vertically through the panel 100. Hence, plated holes in the core, build up and/or outer layer inside of the card area may be provided as stress relief structures 108. According to FIG. 6, the stress relief structures 108 extend only along a single connection line 110.

Figure 7:
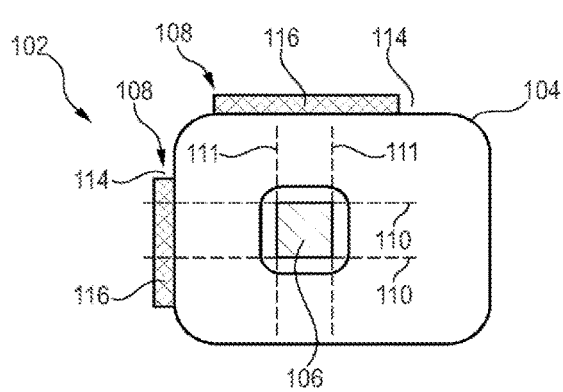

Referring to FIG. 7, the stress relief structures 108 are formed in a similar way as according to FIG. 5, now however located outside of the component carriers 104 and within the transition region 114 between adjacent component carriers 104. Plated slots in the core/buildup/outer layer outside of the card area may be provided as stress relief structures 108.

Figure 8:
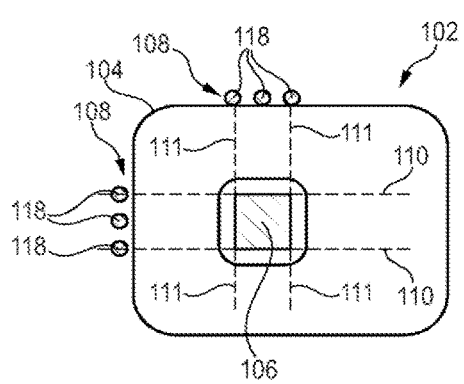

Referring to FIG. 8, the stress relief structures 108 are formed in a similar way as according to FIG. 6, now however located outside of the component carriers 104 and within the transition region 114 between adjacent component carriers 104. Furthermore, the stress relief structures 108 function in two dimensions according to FIG. 8, rather than in one dimension according to FIG. 6. Plated holes in the core, build up and/or outer layer outside of the card area may be provided as stress relief structures 108.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a stack comprising at least one electrically insulating layer structure and a plurality of electrically conductive layer structures;
a component embedded in the stack;
a respective stress relief opening formed in each of the electrically conductive layer structures arranged in the stack on one side of the component so that a portion of the stack extending from an exterior main surface of the component carrier up to a main surface of the component on said side and being delimited by stress relief openings of the plurality of electrically conductive layer structures is free of electrically conductive material; and
at least one stress relief structure arranged in the electrically insulating layer extending in a stacking direction, wherein at least part of the at least one stress relief structure arranged in the stack has a plastic stress behavior, such that the at least one stress relief structure comprises a plurality of plastically deformable material spaced apart from a plurality of lateral sides of the component.

2. The component carrier according to claim 1, wherein the portion consists exclusively of electrically insulating material of the at least one electrically insulating layer structure.

3. The component carrier according to claim 1, wherein the plurality of stress relief openings are in alignment with one another.

4. The component carrier according to claim 1, wherein the portion is a cylindrical structure with vertical side walls.

5. The component carrier according to claim 1, further comprising:

at least one further stress relief opening formed in each electrically conductive layer structure arranged in the stack on an opposing other side of the component so that a further portion of the stack extending from another exterior main surface of the component carrier up to another main surface of the component on said opposing other side and including the at least one further stress relief opening is free of electrically conductive material.

6. The component carrier according to claim 1, wherein the component comprises at least one pad on another main surface of the component facing away from the stress relief openings.

7. The component carrier according to claim 6, wherein no stress relief opening is formed on the side of the component on which the at least one pad is formed.

8. The component carrier according to claim 1, wherein the respective stress relief openings are fully circumferentially delimited by material of the respective electrically conductive layer structure arranged as circular through holes extending through the respective electrically conductive layer structure.

9. The component carrier according to claim 1, wherein the electrically conductive layer structures are continuous layers each having a single through hole forming an assigned one of the stress relief openings.

10. The component carrier according to claim 1, wherein the ratios between the areas of the respective stress relief openings and the area of the main surface of the component are at least 20%.

11. The component carrier according to claim 1, wherein the respective stress relief openings are configured for reducing warpage promoting stress exerted on the component carrier.

12. The component carrier according to claim 1, wherein the at least one stress relief structure is arranged at least partially within a central plane of the component, wherein the central plane of the component extends between the main surface of the component and another main surface of the component.

13. The component carrier according to claim 1, wherein the at least one stress relief structure arranged in the stack is configured for reducing warpage promoting stress exerted on the component carrier.

14. The component carrier according to claim 1, further comprising at least one of the following features:
wherein at least part of the at least one stress relief structure arranged in the stack is shaped as a sheet extending perpendicular to the main surfaces of the component carrier and/or comprises a plurality of parallel posts extending perpendicular to the main surfaces of the component carrier;
wherein a coordinate of a center of gravity of the at least one stress relief structure arranged in the stack in a direction perpendicular to the main surfaces of the component carrier corresponds to a coordinate of a center of gravity of the component in the direction perpendicular to the main surfaces of the component carrier.

15. The component carrier according to claim 1, further comprising at least one of the following features:
the at least one electrically conductive layer structure comprises at least one of the group consisting of copper, aluminum, nickel, silver, gold, palladium, and tungsten, any of the mentioned materials being optionally coated with supra-conductive material such as graphene;

the at least one electrically insulating layer structure comprises at least one of the group consisting of resin, reinforced or non-reinforced resin, epoxy resin or Bis-maleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;

the component carrier is shaped as a plate;

the component carrier is configured as a printed circuit board, or a substrate.

16. The component carrier according to claim 1, wherein areas of the respective stress relief openings are smaller than the main surface of the component and ratios between the areas of the respective stress relief openings and the area of the main surface of the component are at least 10%.

17. A panel, comprising:
an array of a plurality of panel sections each comprising a component carrier having a stack comprising at least one electrically insulating layer structure and a plurality of electrically conductive layer structures;
a component embedded in the stack;
a respective stress relief opening formed in each of the electrically conductive layer structures arranged in the stack on one side of the component so that a portion of the stack extending from an exterior main surface of the component carrier up to a main surface of the component on said side and being delimited by the stress relief openings in the electrically conductive layer structures is free of electrically conductive material; and
at least one stress relief structure arranged in the electrically insulating layer extending in a stacking direction, wherein at least part of the at least one stress relief structure arranged in the stack has a plastic stress behavior, such that the at least one stress relief structure comprises a plurality of plastically deformable material spaced apart from a plurality of lateral sides of the component.

18. The panel according to claim 17, further comprising at least one of the following features:
the at least one stress relief structure is arranged at least partially in a connection line connecting at least two of the components, wherein at least part of the at least one stress relief structure is arranged in a transition region between the component carriers;
wherein part of the at least one stress relief structure is arranged at least partially in a further connection line connecting at least two of the components and extending perpendicular to the connection line.

19. A method of manufacturing a component carrier, the method comprising:
forming a stack comprising at least one electrically insulating layer structure and a plurality of electrically conductive layer structures;
embedding a component in the stack, and
forming respective stress relief openings in each of the electrically conductive layer structures arranged in the stack on one side of the component so that a portion of the stack extending from an exterior main surface of the component carrier up to a main surface of the component on said side, the portion being delimited by the respective stress relief openings, is free of electrically conductive material;
forming at least one stress relief structure arranged in the electrically insulating layer extending in a stacking direction, wherein at least part of the at least one stress relief structure arranged in the stack has a plastic stress behavior, such that the at least one stress relief structure comprises a plurality of plastically deformable material spaced apart from a plurality of lateral sides of the component.

20. The method according to claim 19, wherein areas of the respective stress relief openings are smaller than the main surface of the component and ratios between the areas of the respective stress relief openings and the area of the main surface of the component are at least 10%.

* * * * *